United States Patent
Francis

(10) Patent No.: US 9,973,198 B2
(45) Date of Patent: *May 15, 2018

(54) TELESCOPIC AMPLIFIER WITH IMPROVED COMMON MODE SETTLING

(71) Applicant: Texas Instruments Incorporated, Dallas, TX (US)

(72) Inventor: Roswald Francis, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/495,786

(22) Filed: Apr. 24, 2017

(65) Prior Publication Data

US 2017/0230054 A1 Aug. 10, 2017

Related U.S. Application Data

(63) Continuation of application No. 15/258,237, filed on Sep. 7, 2016, now Pat. No. 9,634,685, which is a (Continued)

(51) Int. Cl.
| | |
|---|---|
| H03F 3/45 | (2006.01) |
| H03M 1/00 | (2006.01) |
| H03F 3/50 | (2006.01) |

(52) U.S. Cl.
CPC ........ H03M 1/001 (2013.01); H03F 3/45237 (2013.01); H03F 3/505 (2013.01); *H03F 2203/45421* (2013.01)

(58) Field of Classification Search
CPC .... H03M 1/167; H03M 1/0682; H03M 1/146; H03M 1/12; H03F 3/45085;
(Continued)

(56) References Cited

U.S. PATENT DOCUMENTS

| | | |
|---|---|---|
| 5,613,233 A | 3/1997 | Vagher |
| 6,353,361 B1 | 3/2002 | Sun |

(Continued)

OTHER PUBLICATIONS

"A High Swing CMOS Telescopic Operational Amplifier", Kush Gulati and Hae-Seung Lee, IEEE Journal of Solid State Circuits, vol. 33, No. 12, pp. 2010-2019, 1998 (10 pages).

(Continued)

*Primary Examiner* — Linh Nguyen
(74) *Attorney, Agent, or Firm* — John R. Pessetto; Charles A. Brill; Frank D. Cimino

(57) ABSTRACT

Telescopic amplifier circuits are disclosed. In an embodiment, a telescopic amplifier includes an input stage for receiving differential input signals, an output stage for outputting differential output signals at the drains of a first output transistor and a second output transistor, a tail current transistor coupled to sources of a first input transistor and a second input transistor, a common mode feedback circuit coupled to the differential output signals and outputting a common mode output signal, and a circuit element coupled between the common mode output signal and a gate of the tail current transistor. In an embodiment the circuit element is a resistor. In another embodiment the circuit element is a source follower transistor. In additional embodiments a phase margin of the common mode feedback open loop gain of the amplifier is determined by the value of the resistor. Additional embodiments are disclosed.

20 Claims, 5 Drawing Sheets

Related U.S. Application Data continuation of application No. 14/470,682, filed on Aug. 27, 2014, now abandoned.

(58) Field of Classification Search
CPC . H03F 2203/45418; H03F 2203/45594; H03F 1/08; H03F 2203/45116; H03F 2203/45144; H03F 2203/45151; H03F 2203/45188; H03F 3/45542; H03F 3/45556
USPC ........ 341/155, 161, 162; 330/253, 258, 260, 330/261
See application file for complete search history.

(56) References Cited

U.S. PATENT DOCUMENTS

| | | | |
|---|---|---|---|
| 6,362,688 B1 | 3/2002 | Au | |
| 6,380,806 B1 | 4/2002 | Ang | |
| 6,529,070 B1 | 3/2003 | Nagaraj | |
| 6,720,805 B1 * | 4/2004 | Haas | H03F 3/45183 326/83 |
| 6,774,722 B2 | 8/2004 | Hogervorst | |
| 7,265,703 B2 * | 9/2007 | Sasaki | H03M 1/002 341/122 |
| 9,634,685 B2 * | 4/2017 | Francis | H03M 1/1245 |
| 2005/0143044 A1 * | 6/2005 | Kim | H04B 1/109 455/334 |
| 2005/0162232 A1 | 7/2005 | Etoh | |
| 2006/0267685 A1 * | 11/2006 | Alenin | H03F 1/48 330/258 |
| 2012/0074987 A1 * | 3/2012 | Piepenstock | H03K 19/018528 327/108 |
| 2012/0182071 A1 * | 7/2012 | Takei | H03F 3/45192 330/253 |
| 2012/0293261 A1 * | 11/2012 | Das | H03F 1/223 330/260 |
| 2013/0207722 A1 * | 8/2013 | Bulzacchelli | H03F 3/195 330/260 |
| 2013/0214944 A1 | 8/2013 | Kosic | |
| 2017/0040952 A1 * | 2/2017 | Dong | H03F 1/3211 |

OTHER PUBLICATIONS

Prosecution History from U.S. Appl. No. 15/258,237 dated Sep. 7, 2016 to Apr. 6, 2017 243 pp.

* cited by examiner

TELESCOPIC AMPLIFIER WITH IMPROVED COMMON MODE SETTLING

RELATED APPLICATIONS

This patent application is a continuation of U.S. patent application Ser. No. 15/258,237, filed Sep. 7, 2016, which application is a continuation of U.S. patent application Ser. No. 14/470,682, filed Aug. 27, 2014, and claims priority to India Provisional Patent Application No. 3826/CHE/2013, filed Aug. 28, 2013, all of which are incorporated herein by reference in their entirety.

TECHNICAL FIELD

The embodiments relate generally to the use of telescopic amplifiers. Applications of telescopic amplifiers include, for example, in analog to digital conversion using pipelined topologies with residue amplifiers, although the telescopic amplifiers are also used in additional applications. The embodiments advantageously provide improved common mode settling performance in telescopic amplifiers without substantially increasing circuit complexity, and without increasing power consumption.

BACKGROUND

Recent improvements for amplifiers used in analog signal applications such as analog to digital conversion include the use of telescopic amplifiers. Telescopic amplifiers provide relatively high frequency response with relatively low power. These telescopic amplifiers are therefore attractive for a variety of applications, particularly and increasingly for portable devices where low power is an important requirement. In an application, within a pipelined analog to digital converter ("ADC") circuit topology, telescopic amplifiers are increasingly used as the residue amplifier. In the pipelined ADC, for each of a plurality of stages, the analog input signal is converted to one or more digital bits that approximate a magnitude of the analog signal, e.g. the input signal is quantized. The digital bits of the output are then converted back to an analog signal using a digital to analog converter (DAC), and the converted quantized signal, now an analog voltage corresponding to the quantized value, is subtracted from the input signal. These functions are commonly performed using a switched capacitor circuit known as a "MDAC", or multiplying digital to analog converter. The residue, which is the difference between the input signal and the analog to digital converted version of the quantized digital output signal, is then amplified in a residue amplifier. The amplified residue signal is used as the input signal for the next stage of the pipelined ADC converter. In this manner the input analog signal is successively converted to a multiple bit digital representation in pipelined ADC stages. While other amplifiers can be used in the pipelined ADC, telescopic amplifiers are increasingly used as the residue amplifier. Additional discussion of telescopic amplifiers may be found, for example, in U.S. Pat. No. 6,529,070, entitled "Low Voltage Broadband Telescopic Amplifier", which is co-owned with the present application, and which is hereby incorporated in its entirety herein by reference.

FIG. 1 depicts, in an example simplified circuit diagram, a telescopic operational amplifier circuit 10 of the prior art. In FIG. 1, circuit 10 has a terminal INP for receiving a positive differential signal arranged with a terminal INM for receiving a complementary differential input signal. An input stage is formed by transistor MNINP, with a gate coupled to the positive input terminal INP, and transistor MNINM having a gate coupled to the complementary input terminal INM. The input stage transistors MNINP and MNINM have their respective source regions coupled together to form a common source terminal. The common source from the two input transistors MNINM and MNINP is coupled to the drain of the tail current transistor, MNTAIL.

A cascode output stage is formed by transistors MNCASP and MNCASM. Each of these output stage transistors has a gate coupled to the cascode bias voltage CAS_BIAS. The current sources IP and IM supply bias current to the drain terminals of the transistors MNCASP and MNCASM. These current sources IP=IM=I, where I is the bias current of the circuit stage. Each of the output stage transistors MNCASP and MNCASM has a source that is coupled to the drain of the respective one of the input stage transistors MNINP and MNINM.

The circuit 10 has differential output terminals OUTP and OUTM for transmitting positive and complementary differential output signals to the next stage of the circuit. The output terminals OUTP and OUTM are coupled to the drains of MNCASP and MNCASM, the differential output transistors. In order to illustrate the operation of the circuit 10, the sampling portion of the next stage circuit 20 is depicted. A switched capacitor circuit, the sample stage circuit 20 includes the clocked switches implemented by transistors MNSWIP and MNSWIM. When the clock signal CLK is true, or at a high voltage, the gates of these switches are coupled to the CLK signal, and the transistors MNSWP and MNSWM couple the output terminals OUTP and OUTM to the sample capacitors CP and CM in the switched capacitor sample circuit 20. The sampled values are then available for a later transfer into the next stage circuit (not shown).

In FIG. 1, a common mode feedback circuit 30 is depicted. This common mode feedback circuit 30 is another switched capacitor circuit formed of transistors MN1, MN3, MN5, and MN2, MN4, MN6, and capacitors CRFP, CRFM, CCMFBP, CCMFBN. The inputs are common mode reference signals REFCM and a bias signal BIAS. The clock signal CLK and the inverted clock signal CLK_BAR are non-overlapping, complementary clocking signals. When the CLK_BAR signal is high, or true, the transistors MN2, MN4 and MN6 act as closed switches and the capacitors CRFP and CRFM have the voltage REFCM-BIAS across them. When the CLK signal is true, or high, the common mode feedback capacitors CCMFBP and CCMFBN are shorted to the capacitors CRFP and CRFM, which store the common mode reference voltages. Input terminal REFCM fixes the output common mode of the amplifier to a common mode reference input voltage. The differential output terminals OUTP and OUTM of the telescopic amplifier are coupled to the capacitors CCMFBP and CCMFBM to form the common mode feedback path of the telescopic amplifier 10. The common mode feedback circuit has an output at node CMOUT.

The gate of the tail current transistor MNTAIL is coupled to the common mode feedback circuit at node CMOUT. In this manner a common mode settling current (shown as Icm in the figure) flows through the tail transistor MNTAIL. The common mode settling current Icm should be equally shared between the two branches of the differential circuit, shown as currents Icm/2 in FIG. 1. Differential settling current Idiff is also shown. Note that in the circuit diagram of FIG. 1, the input stage and output stage transistors MNINP, MNINM, MNCASP, MNCASM, are each illustrated as formed using N type MOSFET transistors, and the tail transistor MNTAIL is also shown as formed using an N-type MOSFET transistor. However, one skilled in the art will recognize that other transistor types including P-type MOSFET transistors could be used instead of the N-type MOSFET transistors shown in this illustrative example, the substitution could be made to replace the N type MOSFET transistors with P type MOSFET transistors, and in other respects, the circuit topology and functions of the telescopic amplifier circuit 10 would remain the same.

The telescopic amplifier circuit 10 of FIG. 1 may be used with a pre-amplifier (not shown for simplicity) in a residue amplifier for an ADC circuit to provide relatively high gain bandwidth at relatively low power. However, the common mode settling characteristics of the prior art telescopic amplifier 10 shown in FIG. 1 are poor. The common mode feedback loop bandwidth is low when compared to the differential bandwidth; typically it is ½ to ⅓rd of the differential bandwidth.

As can be seen in FIG. 1, the next stage sampling circuit 20 will receive the common mode and differential current when CLK is high. The transistors MNSWP and MNSWP in sampling circuit 20, also shown here as N-type MOSFET transistors, have resistances which, ideally, are perfectly matched. However in an actual physical circuit the resistances of these two transistors will not match perfectly due to process, temperature and voltage variations (PVT). Due to the resistance mismatch of these sampling transistors, poor common mode current settling may lead to an error in the sampling circuit in the next stage. That is, a differential current error may occur due to the presence of a common mode settling current.

The common mode feedback loop of the circuit of FIG. 1 is effectively a single pole system. Using a circuit analysis that neglects differential mode signals and that is for the common mode signals only, the common mode feedback loop gain expression for the structure in FIG. 1 is:

$$LPG = (\beta * Gmn\text{tail}/(2C_L s + gd)) \quad \text{(Equation 1)}$$

Where: $\beta = C_{CM}/C_{CM} + C_{TAIL}$, and gd=the output conductance of one arm of the telescopic structure, which is very small, and Gmntail is the transconductance of the tail transistor MNTAIL.

From Equation 1, it can be seen that the transfer function for the loop gain, for common mode, is a single pole system with a pole located at:

$$P1 = gd/C_L (\text{radians/second}). \quad \text{(Equation 2)}$$

P1 is the single, dominant pole in the common mode feedback transfer function. In this analysis, the cascade pole and the pole due to the input transistors were neglected, as these poles will be fractions of $f_T$ of the corresponding transistors, and will be located far from the common mode feedback unity gain bandwidth, $\omega_{ugh}$.

The capacitance $C_{CM}$ can be determined as:

$$C_{CM} = (CCMFBP + CCMFBM + CRFP + CRFM), \text{ where } CRFP = CRFM \text{ and } CCMFBP = CCMFBM. \quad \text{(Equation 3)}$$

The tail capacitance $C_{TAIL}$ can be determined as:

$$C_{TAIL} = CROUTP + C_{GDSTAIL} + C_{GDMILLER}, \quad \text{(Equation 4)}$$

where CROUTP is a parasitic routing capacitance (as indicated by the dashed lines used to represent it in FIG. 1), and $C_{GDSTAIL}$ and $C_{GDMILLER}$ are the gate to source capacitance and gate to drain (including Miller effect) capacitances of the tail transistor MNTAIL in FIG. 1.

The load capacitance CL can be determined as:

$$CL = COUTP + CP, COUTM + CM, \quad \text{(Equation 5)}$$

where: COUTP=COUTM are the parasitic routing capacitances at the output of the telescopic amplifier, (as shown by the dashed lines used to draw these capacitors in FIG. 1) and the capacitors CM and CP, as shown in FIG. 1, are part of the sampling circuit 20 that is for the next stage. The sampling time constant is small compared to the time 1/ωugb.

Taking these factors into account, then, the unity gain bandwidth $\omega_{ugb}$ for the common mode feedback loop can be determined as:

$$\omega_{ugb} = \beta Gmn\text{tail}/2C_L. \quad \text{(Equation 6)}$$

As discussed above, the sampling transistors MNSWIP and MNSWIM of the next stage sampling circuit 20 in FIG. 1 may have resistances that are not equal. The resistances may be mismatched due to process variations, temperature dependence variations, and/or a variation in voltage swing. If the common mode settling for the circuit 10 is poor, then a current due to common mode settling may produce a differential voltage across these sampling switches and generate a sampling error in the sampling capacitors CP and CM. This error may not be acceptable in a particular circuit, in the high resolution residue stage for a pipelined ADC circuit, for example. The common mode settling current may appear as a differential current to the sampling stage, causing error.

One known approach to this problem is to try to precisely match the sampling transistor devices, MNSWIP and MNSWIM, to reduce the resistance mismatch, by tightly controlling the process, voltage and temperature (PVT) corner. This is very difficult to do in advanced semiconductor processes, and can reduce device yield, increasing the per device costs. Another known approach is to try and reduce the common mode current by improving the common mode feedback settling. The unity gain bandwidth $\omega_{ugb}$ could be increased but at the cost of extra power in the telescopic structure. However, increasingly the applications for the telescopic amplifier are for portable devices, which are often battery powered devices, thus this increase in power consumption is also undesirable.

Improvements in the common mode settling characteristics for telescopic amplifiers are therefore needed to address the deficiencies and the disadvantages of the known prior approaches. Solutions are needed that do not require additional power, and which do not negatively impact the noise performance and the differential settling performance of the telescopic amplifier circuits.

SUMMARY

The embodiments provide telescopic amplifier circuits with improved common mode settling characteristics. In an embodiment, a telescopic amplifier includes an input stage for receiving differential input signals, an output stage for outputting differential output signals at the drains of a first output transistor and a second output transistor, a tail current transistor coupled to sources of a first input transistor and a second input transistor, a common mode feedback circuit coupled to the differential output signals and outputting a common mode output signal, and a circuit element coupled between the common mode output signal and a gate of the tail current transistor. In an embodiment the circuit element is a resistor. In another embodiment the circuit element is a source follower transistor. In additional embodiments a phase margin of the common mode feedback open loop gain of the amplifier is determined by the value of the resistor.

In the embodiments, a telescopic amplifier further includes an input stage comprising a first input transistor having a gate terminal coupled to a positive input terminal, and a second input transistor having a gate terminal coupled to a complementary input terminal; an output stage comprising a first output transistor having a source coupled to a drain of the first input transistor and having a first current source coupled to a drain of the first output transistor, and a second output transistor having a source coupled to a drain of the second input transistor, and having a second current source coupled to a drain of the second output transistor, a first output terminal coupled to the drain of the first output transistor, and a second output terminal coupled to the drain of the second output transistor, the first and second output transistor each having gates coupled to a bias voltage terminal; a tail current transistor having a drain coupled to a common source node coupled to the source of each of the first and second input transistors, having a source coupled to a ground potential, and having a gate terminal coupled to a tail gate node; a common mode feedback circuit having a first feedback input coupled to the first output terminal, and a second feedback input coupled to the second output terminal, and having a common mode reference signal input; and having a common mode output; and a resistor coupled between the common mode output and the tail gate node.

In further embodiments, the telescopic amplifier includes a switched capacitor sampling circuit coupled to the first output terminal and to the second output terminal, and having a first sampling transistor and a first positive output capacitor coupled to sample the voltage at the first output terminal, and having a second sampling transistor and a first complementary output capacitor coupled to sample the voltage at the second output terminal, responsive to a clock signal coupled to the gates of the first sampling transistor and the second sampling transistor.

In still another embodiment, in the telescopic amplifier, the common mode feedback circuit further comprises a switched capacitor circuit. In additional embodiments the common mode feedback circuit further comprises a first transistor coupled between the first output terminal and a first plate of a first sample hold capacitor; a second transistor coupled between a reference common mode input and the first plate of the first sample hold capacitor; a third transistor coupled between an common mode output signal and a bias node that is coupled to a second plate of the first sample and hold capacitor; a fourth transistor coupled between the bias node and a bias voltage input terminal; a fifth transistor coupled between the second output terminal and a first plate of a second sample hold capacitor, the second sample hold capacitor having a second plate coupled to the bias node; a sixth transistor coupled between the reference common mode input and the first plate of the second sample hold capacitor; a first common mode feedback capacitor having a first plate coupled to the first output terminal, and a second plate coupled to the common mode output; a second common mode feedback capacitor having a first plate coupled to the second output terminal and a second plate coupled to the common mode output; the second, fourth and sixth transistors each having a gate coupled to an inverted clock signal, and the first, third and fifth transistors each having a gate coupled to a clock signal, the clock signal being non-overlapping with the inverted clock signal.

In still another embodiment, in the telescopic amplifier described above, when the inverted clock signal is active, the voltage across the first sample hold capacitor is a reference common mode voltage received at the reference common mode input minus a bias voltage received at the bias voltage input, and the voltage across the second sample hold capacitor is the reference common mode voltage received at the reference common mode input minus the bias voltage received at the bias voltage input. In another embodiment, in the telescopic amplifier described above, whereby when the clock signal is active, the first common mode feedback capacitor is shorted to the first sample hold capacitor, and the second common mode feedback capacitor is shorted to the second sample hold capacitor.

In a further embodiment, in the telescopic amplifiers described above, a common mode feedback open loop gain transfer function of the telescopic amplifier has a dominant pole due to a load capacitance comprising a sum of the first positive output capacitor and a routing capacitance at the first output terminal, and the common mode feedback open loop gain transfer function of the telescopic amplifier further has a non-dominant pole due to the resistor.

In still another embodiment of the telescopic amplifier, the non-dominant pole is located at a frequency P2 that is approximately equal to a quantity $(C_{CM}+C_{TAIL}/\text{Rpole}C_{CM}C_{TAIL})$, where a capacitance $C_{CM}$ is a sum of the first and second common mode feedback capacitors and the first and the second sample and hold capacitors, a capacitance $C_{TAIL}$ is a sum of the gate to source capacitance of the tail transistor plus the gate to drain capacitance of the tail transistor plus a parasitic routing capacitance at the gate of the tail transistor, and a resistance Rpole is a value of the resistor.

In another embodiment, a telescopic amplifier includes a differential input stage for receiving a positive input signal and a complementary input signal comprising a first input transistor having a gate terminal coupled to a positive input terminal, and a second input transistor having a gate terminal coupled to a complementary input terminal, the first input transistor having a drain and the second input transistor having a drain; a differential output stage for outputting a positive output signal and a complementary output signal comprising a first output transistor having a source coupled to the drain of the first input transistor and having a first current source coupled to a drain of the first output transistor, and a second output transistor having a source coupled to the drain of the second input transistor and having a second current source coupled to a drain of the second output transistor, and a first output terminal coupled to the drain of the first output transistor, and a second output terminal coupled to the drain of the second output transistor; a tail current transistor having a drain coupled to a common source node coupled to a source of each of the first and the second input transistors, and having a source coupled to a ground potential, and having a gate terminal coupled to a tail gate node; a common mode feedback circuit having a first feedback input coupled to the first output terminal, and a second feedback input coupled to the second output terminal, and having a common mode reference signal input; and having a common mode output; and a circuit element coupled between the common mode output and the tail gate node; whereby a non-dominant pole is formed in a common mode feedback open loop gain transfer function of the telescopic amplifier, due to the circuit element.

In another embodiment, a pipelined ADC converter includes an input terminal for receiving an analog input voltage; an N-bit ADC coupled to the input terminal for outputting a quantized digital signal; an N-bit DAC coupled to the quantized digital signal and outputting an analog voltage corresponding to the quantized digital signal; a sample and hold circuit coupled to sample and hold an analog input voltage received at the input terminal; a summer circuit coupled to the sample and hold circuit and to the analog voltage corresponding to the quantized digital signal, outputting a difference voltage that is a residue voltage obtained from subtracting the analog voltage corresponding to the quantized digital signal from the sample and hold analog voltage; and a telescopic amplifier coupled to the summer circuit to amplify the residue voltage, further comprising: a differential input stage for receiving a positive input signal and a complementary input signal comprising a first input transistor having a gate terminal coupled to a positive input terminal, and a second input transistor having a gate terminal coupled to a complementary input terminal, the first input transistor having a drain and the second input transistor having a drain; a differential output stage for outputting a positive output signal and a complementary output signal comprising a first output transistor having a source coupled to the drain of the first input transistor and having a first current source coupled to a drain of the first output transistor, and a second output transistor having a source coupled to the drain of the second input transistor and having a second current source coupled to a drain of the second output transistor, and a first output terminal coupled to the drain of the first output transistor, and a second output terminal coupled to the drain of the second output transistor; a tail current transistor having a drain coupled to a common source node coupled to a source of each of the first and the second input transistors, and having a source coupled to a ground potential, and having a gate terminal coupled to a tail gate node; a common mode feedback circuit having a first feedback input coupled to the first output terminal, and a second feedback input coupled to the second output terminal, and having a common mode reference signal input; and having a common mode output; and a circuit element coupled between the common mode output and the tail gate node, whereby a non-dominant pole is formed in a common mode feedback open loop gain transfer function of the telescopic amplifier, due to the circuit element. In a further embodiment, in the pipelined ADC converter described above, the circuit element in the telescopic amplifier further comprises a resistor. In a further embodiment, in the pipelined ADC converter above, the common mode feedback open loop gain transfer function of the telescopic amplifier has a dominant pole due to a load capacitance comprising the sum of an output capacitor coupled to the first output terminal and a routing capacitance at the first output terminal, and the common mode feedback open loop gain transfer function has a non-dominant pole due to the resistor.

Previously, use of the telescopic amplifier as a residue amplifier was sometimes considered inappropriate, as the common mode settling characteristics of the telescopic amplifier circuit were poor. Recognition in the embodiments of a simple solution that provides improved common mode settling due to use of the telescopic amplifier circuits of the embodiments surprisingly overcomes the problems and deficiencies of the prior art circuits, without requiring additional power, and without degrading the differential performance characteristics of the telescopic amplifier.

BRIEF DESCRIPTION OF THE DRAWINGS

For a more complete understanding of the illustrative embodiments described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and the examples described do not limit the scope of the specification, or the scope of the appended claims.

For example, when the term "coupled" is used herein to describe the relationships between elements, the term as used in the specification and the appended claims is to be interpreted broadly, and is not to be limited to "connected" or "directly connected" but instead the term "coupled" may include connections made with intervening elements, and additional elements and various connections may be used between any elements that are "coupled".

In the embodiments, novel solutions are provided to improving the common mode settling performance of a telescopic amplifier. The embodiments overcome the problems of the known prior approaches. In a first embodiment, it is recognized that in the prior art circuits, the common mode feedback open loop gain has a single pole. However, it is comprehended in the embodiments that for a given common mode feedback unity gain bandwidth, a two pole system has a faster settling time than a single pole system. Because the common mode feedback unity gain bandwidth is small compared to the other poles present in the system (because the other poles are designed for differential settling, not for common mode), it is surprisingly discovered that the common mode settling for the telescopic amplifier may be improved by using a two pole system, with a second non-dominant pole located away from the first dominant pole. The second pole should be placed so that the system has proper phase margin, that is, so the system is properly damped, but is not overdamped, and thus has fast common mode feedback settling.

Figure 2:
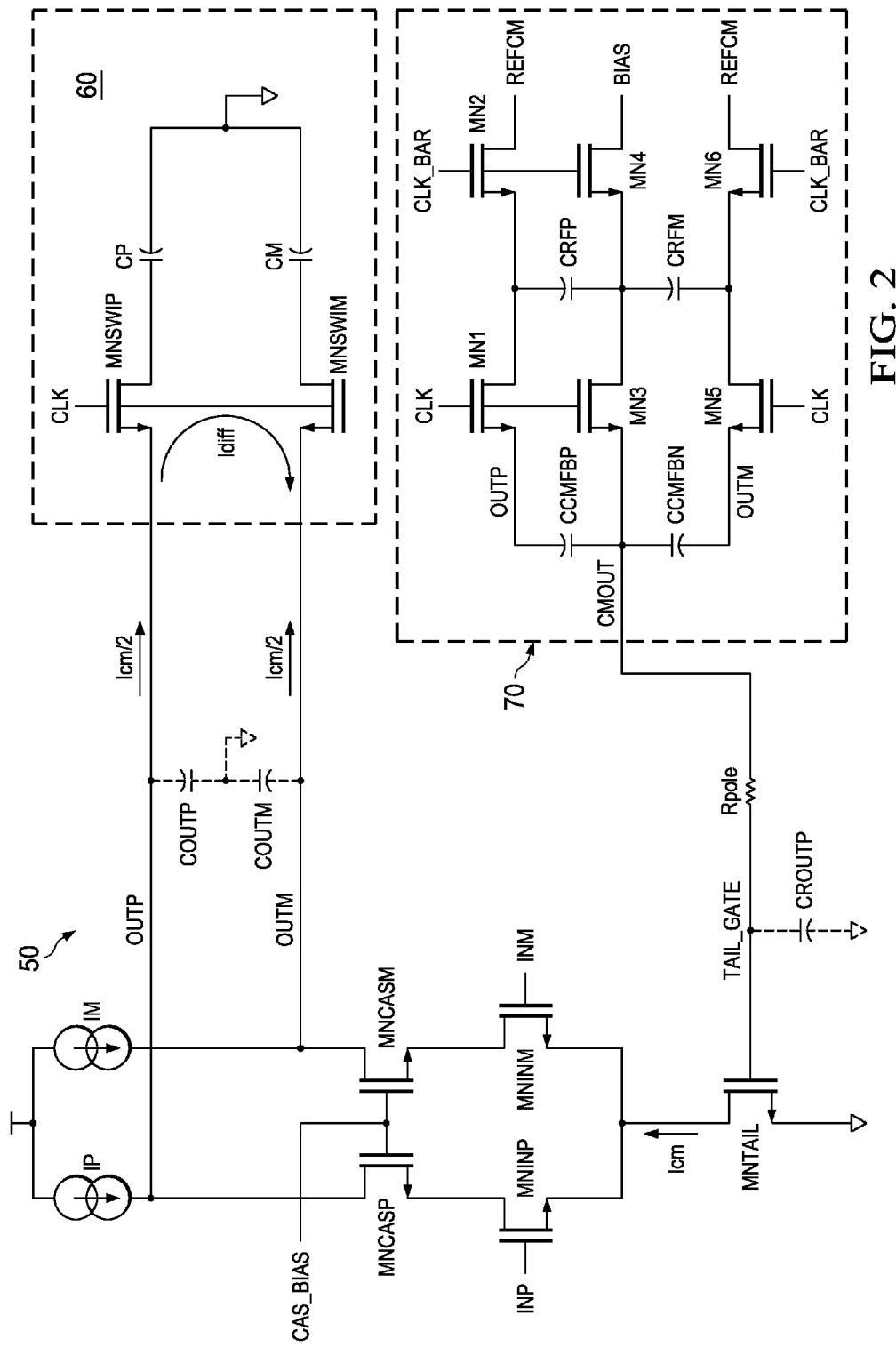
FIG. 2 illustrates in a simplified circuit diagram an embodiment telescopic amplifier.

FIG. 2 illustrates in a simplified circuit diagram an example circuit embodiment 50 that provides the new second pole.

In FIG. 2, a telescopic amplifier circuit 50 is shown. In some respects the circuit 50 is the same as circuit 10 shown in FIG. 1. The input sampling circuit 60 is shown coupled to the differential output terminals OUTP and OUTM, which are taken at the drains of the cascode transistors MNCASP and MNCASM. The differential inputs INP and INM are coupled to the gates of input differential transistors MNINP and MNINM. The tail transistor MNTAIL is again coupled to the common sources of the input differential transistors MNINP and MNINM. The common mode feedback is provided by coupling the output terminals OUTP and OUTM to the inputs of switched capacitor common mode feedback circuit 70, which in this example is identical to the common mode feedback circuit 30 in FIG. 1.

Figure 1:
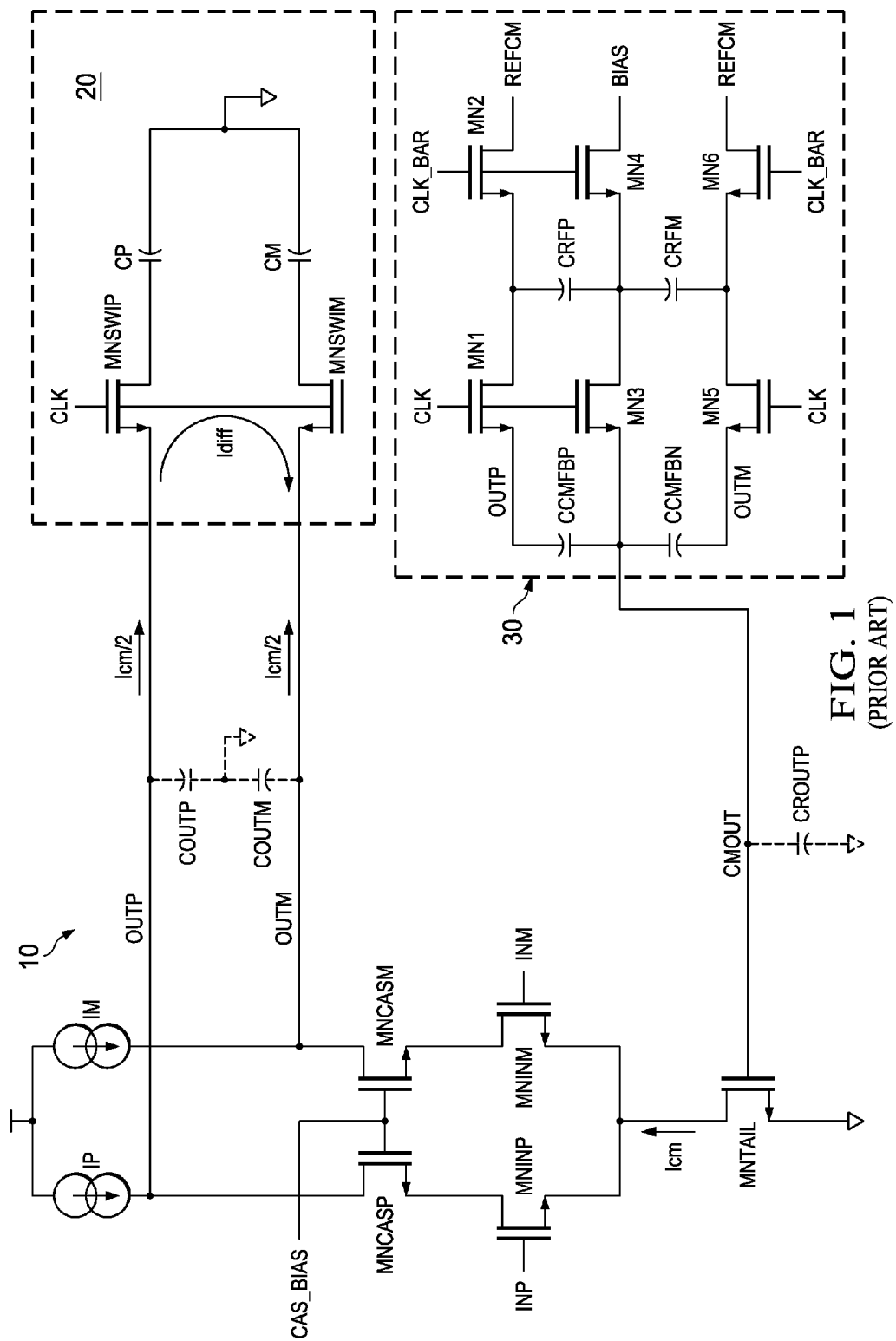
FIG. 1 illustrates in a simplified circuit diagram a prior art telescopic amplifier circuit.

In FIG. 2, the telescopic amplifier as shown in FIG. 1 is modified in that an additional circuit element is placed between the output of common mode feedback circuit 70, at node CMOUT, and the gate of the tail transistor MNTAIL at node TAILGATE. In this example illustrative embodiment, a resistance in the form of an added resistor labeled Rpole is used for the added circuit element. The remainder of the elements of telescopic amplifier circuit 50 shown in FIG. 2 are connected in the same way as in telescopic amplifier circuit 10, shown in FIG. 1.

The common mode feedback open loop gain expression for the circuit 50 can now be expressed as:

$$LPG = \beta Gmn\text{tail}/2(C_L s + gd)(1 + (sR_{pole} C_{CM} C_{TAIL}/C_{CM} + C_{TAIL})) \quad \text{(Equation 6)}$$

The location of the new non-dominant pole is given by:

$$P2 = C_{CM} + C_{TAIL}/R pole C_{CM} C_{TAIL} \quad \text{(Equation 7)}$$

The location of the non-dominant pole should be selected to provide proper damping of the system. A critically damped system will have a damping factor of 1, which for a two pole transfer function will be obtained by placing the pole P2 at the frequency $4\omega_{ugb}$. This frequency for the second pole correlates to a phase margin of 76 degrees, the critically damped condition for a two pole system, which will prevent oscillation and instability (which can occur for an underdamped case) without unduly slowing the system (which can occur for an overdamped case). Since the embodiments provide the circuit designer a variable (the value of Rpole) to control the phase margin obtained, in an embodiment the value for Rpole may be selected to obtain critical damping of the common mode feedback system. However, in alternative embodiments, other similar phase margin values could be chosen by varying the value of the added resistance Rpole, so long as the common mode settling is improved and the system is properly damped and is stable. Accordingly, other phase margins could be selected, such as 70 degrees, that have good performance, and the value for Rpole can be varied to obtain the desired damping factor. Circuit simulations may be used to optimize the value for Rpole in a given semiconductor process.

By substitution, the value for the resistor Rpole for the critically damped case described above can now be determined as:

$$R_{pole} = (C_L/2\beta^2 C_{TAIL} Gmn\text{tail}) \quad \text{(Equation 7)}$$

Thus the use of the telescopic amplifier circuit embodiment of FIG. 2 surprisingly provides the new non-dominant pole by incorporating a simple added resistance. The common mode settling performance of the telescopic amplifier is advantageously improved by use of the embodiments (because for a given common mode feedback unity gain bandwidth, a two pole system settles faster than a single pole system). For a small settling error, the two pole system requires only half the bandwidth of the single pole system. The advantages achieved by the use of the embodiments are surprisingly attained without added power consumption in the circuit. Further, the common mode settling of the telescopic amplifier is improved with no impact on the common mode feedback bandwidth, because the added resistance does not affect the location of the dominant pole. The added resistance may add some noise, but because the noise is in the common mode, it is rejected in the differential stage. That is, any noise added by the added resistance in the common mode feedback path is not differential noise.

Figure 3:
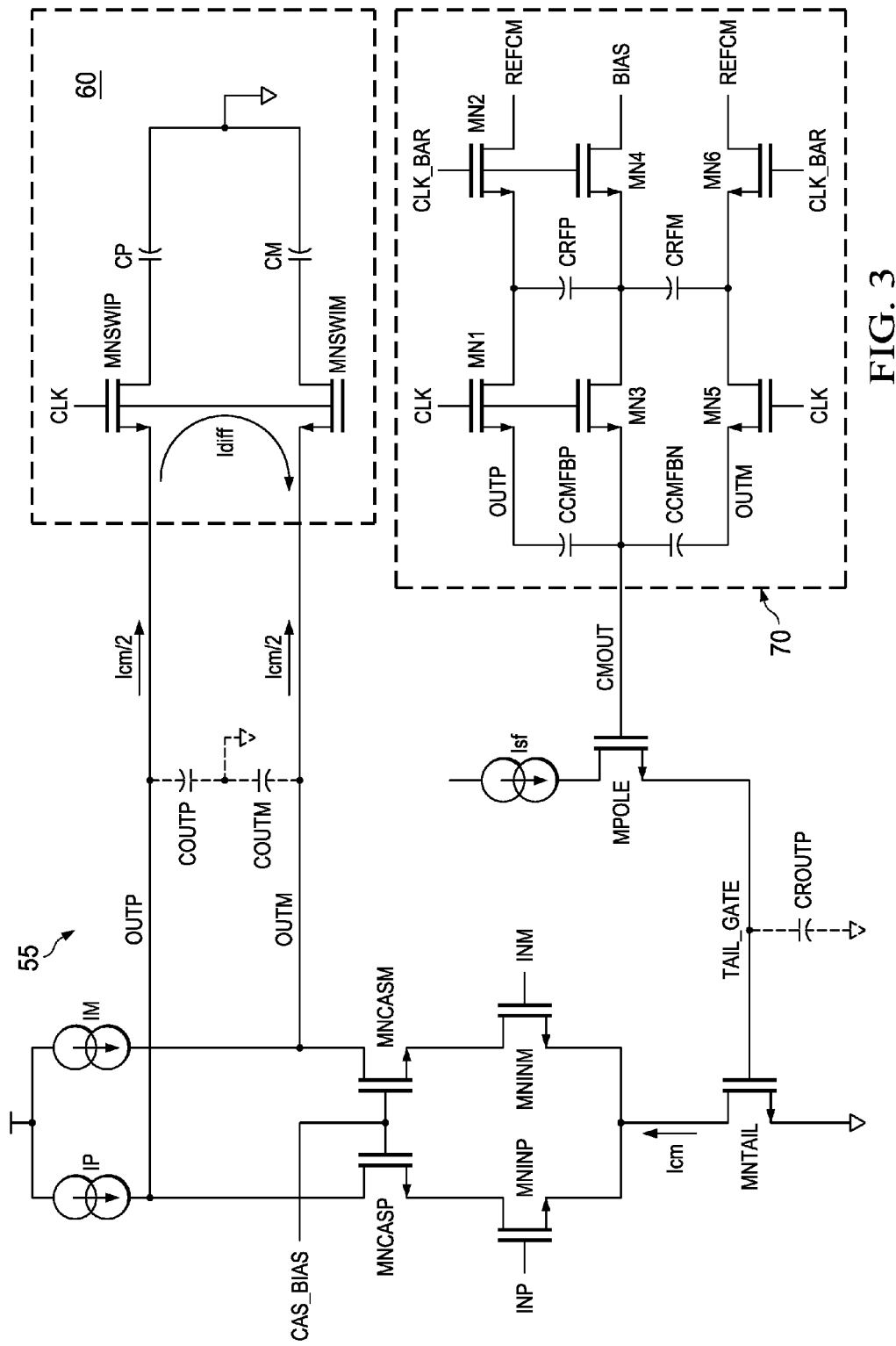
FIG. 3 illustrates in another simplified circuit diagram an additional embodiment telescopic amplifier.

FIG. 3 illustrates another embodiment telescopic amplifier 55 that also provides a second, non-dominant pole that is used to improve common mode settling. In FIG. 3, a less preferred approach is used to provide the second pole. Instead of adding a circuit element that is a resistor between the common mode feedback circuit output and the gate of the tail current transistor MNTAIL to create the second pole, as in FIG. 2, in this alternative embodiment a source follower transistor, labeled MPOLE, is coupled between the output of the common mode feedback circuit 30, at mode CMOUT, and the gate of the tail transistor MNTAIL, at node TAIL_GATE.

While the use of the source follower transistor MPOLE in the common mode feedback path of FIG. 3 will also provide the needed second pole, and thus reduce the common mode settling time for the telescopic amplifier 55 over the prior art circuits, the use of the source follower transistor MPOLE as shown in FIG. 3 will also require additional power, and requires another bias circuit Isf, and will slightly reduce the common mode feedback bandwidth. Thus the circuit 55 of FIG. 3 illustrates an additional embodiment that is contemplated as a useful alternative to the embodiment of FIG. 2, and which falls within the scope of the appended claims. However, the embodiment shown in FIG. 2 is preferred over this alternative embodiment in FIG. 3, because in the embodiment of FIG. 2, no additional power is required, no added bias circuit is needed, and the overall impact on the performance of the telescopic amplifier is less.

By adding the second pole as described in the embodiments above, improved common mode settling in telescopic amplifiers is unexpectedly achieved with little or no additional power and with almost no reduction in the common mode feedback unity gain bandwidth. Improving the common mode settling improves the slew rate of the telescopic amplifier circuit and the differential settling, as the biasing current settles faster in the input transistors.

Figure 4:
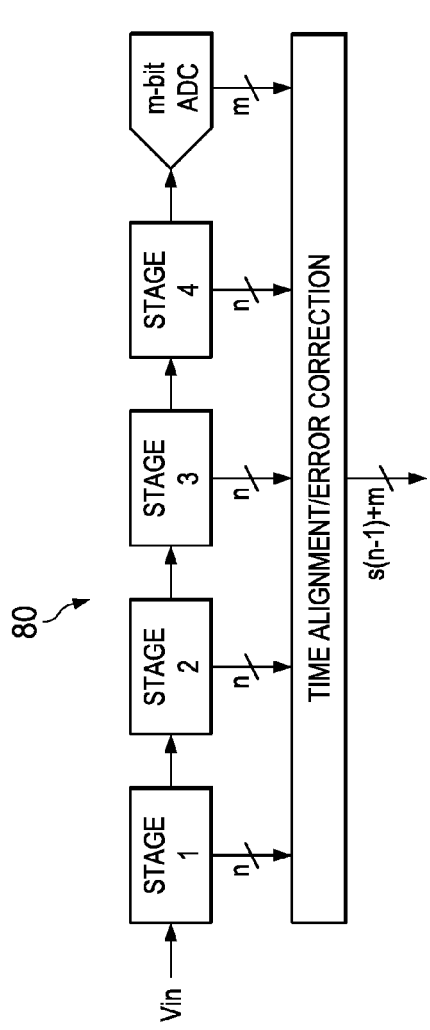
FIG. 4 illustrates in a simplified block diagram a pipelined analog to digital converter in an example application for use with the embodiments.

FIG. 4 illustrates in a simplified block diagram a pipelined analog to digital converter (ADC) 80 to illustrate an application where the embodiments may be advantageously used. In FIG. 4, an analog voltage is received at an input terminal Vin. A plurality of identical stages of ADC converters labeled Stage 1, Stage 2, etc. are arranged in succession and are coupled to one another. Each ADC stage outputs n bits of quantized data. The number of bits n for a given stage may be 1, 2 or more and may be as much as 5, 6 or more. That is, the number of bits n can vary. The number of ADC stages Stage 1, Stage 2, etc. can also vary. The stages each also output a residue voltage, which is the voltage that is input to the next successive ADC stage. The final ADC stage is only a m-bit ADC converter that has no voltage residue output. The quantized output is then collected, and time alignment and error correction is performed, as shown by the block labeled "Time alignment/Error correction" in FIG. 4. Finally an output that is a digital representation of the analog voltage Vin is obtained. This digital output has s(n−1)+m bits.

Figure 5:
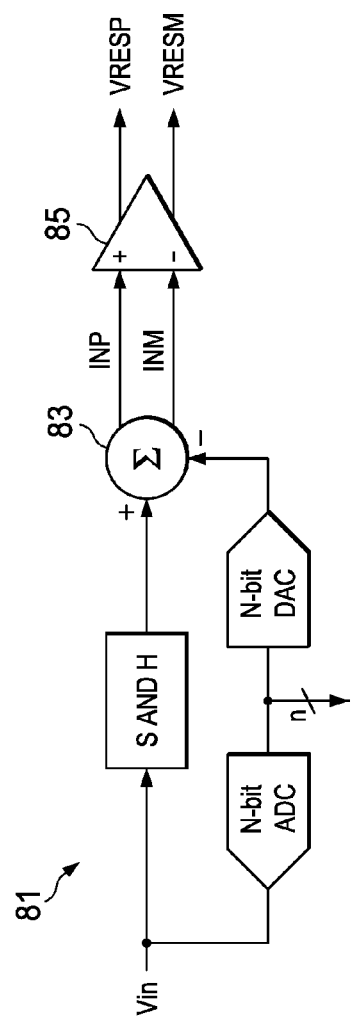
FIG. 5 illustrates in a simplified circuit diagram a single stage of the pipelined analog to digital converter of FIG. 4, including a telescopic amplifier of the embodiments.

In FIG. 4, each ADC pipelined stage, Stage 1, Stage 2 etc. can be implemented as an identical ADC-DAC circuit. FIG. 5 illustrates the ADC-DAC circuit 81 in a simplified circuit diagram. In FIG. 5, the input voltage Vin is an analog voltage, for example it may be a residue voltage from the prior stage. The input voltage is received into a flash analog to digital converter labeled "N-bit ADC" that outputs n quantized bits. These n bits are also immediately taken into a digital to analog converter labeled "N-bit DAC". The output of the N-bit DAC is an analog voltage corresponding to the voltage represented by the quantized bits n. The input voltage Vin is also received into a sample and hold function labeled "S&H". The sampled voltage is then input to a summer 83 that subtracts the analog output of the N-bit DAC (analog version of the quantized voltage) from the sampled analog input voltage, forming an output which is the difference between the quantized voltage and the input voltage, called the residue. In some pipelined ADC converters that use switched capacitor circuitry, a multiplying DAC or "MDAC" circuit performs the sample and hold, and the N-bit DAC functions. The residue signal is then input into amplifier 85, the residue amplifier. In a typical ADC converter, the residue amplifier 85 is a differential input amplifier and outputs differential outputs, the amplified residue voltage, for sampling by the next successive stage in the pipelined ADC circuit.

In an ADC application incorporating the embodiments, the telescopic amplifiers of either FIG. 2 or FIG. 3 can be used, for example, as the residue amplifier 85 of each of the ADC stages. Therefore additional embodiments which are pipelined ADC circuits are also contemplated by the inventors herein. These additional embodiments are formed by using the embodiment telescopic amplifiers in a pipelined ADC converter. These additional embodiments are also within the scope of the appended claims.

Figure 6:
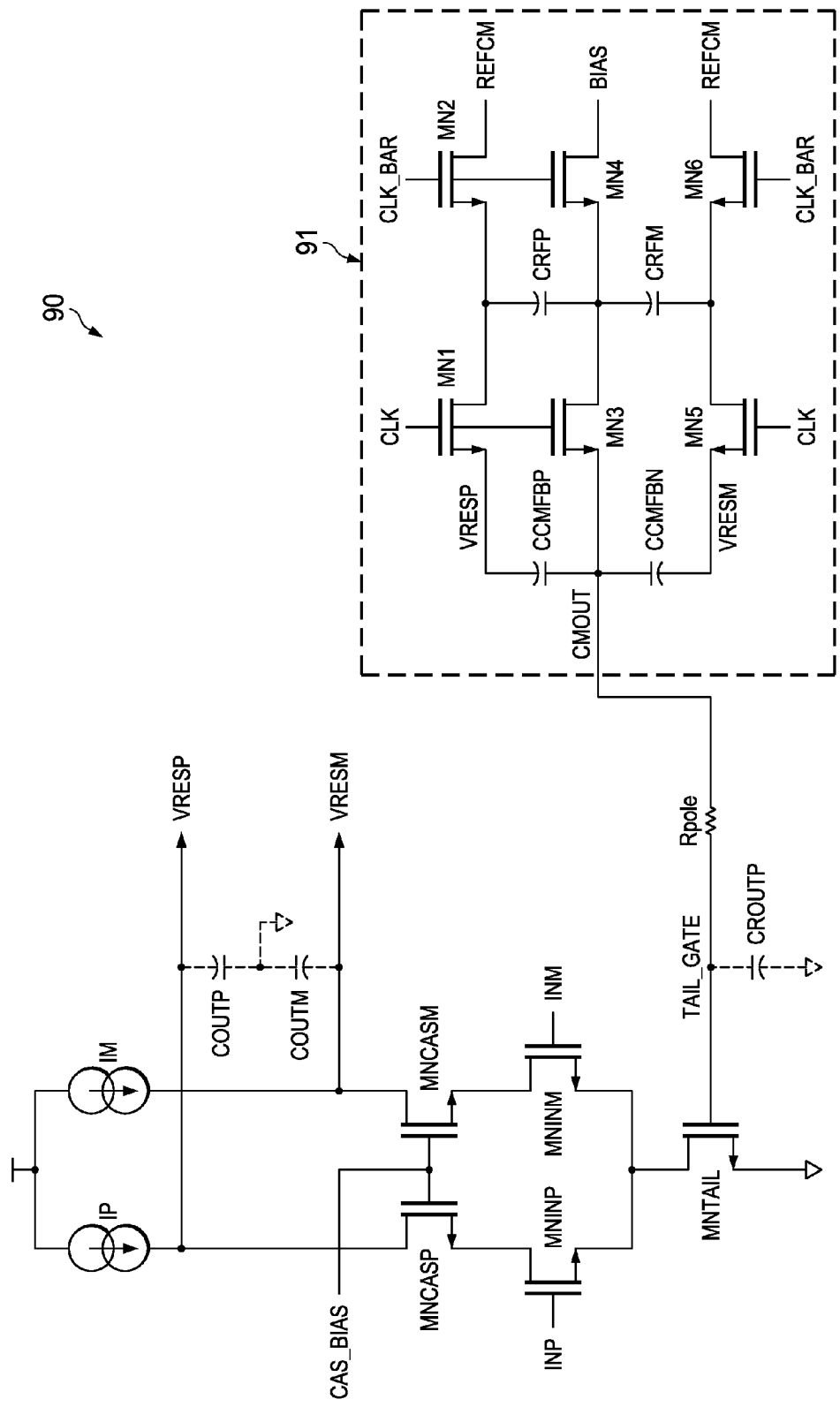
FIG. 6 illustrates in a simplified circuit diagram a residue amplifier for use in the single stage of the pipelined ADC converter of FIG. 5, incorporating a telescopic amplifier of the embodiments.

FIG. 6 illustrates in another simplified circuit diagram an embodiment of the telescopic amplifier 90 using the added resistance RPOLE to improve the common mode settling, configured for use as the residue amplifier of FIG. 5. In FIG. 6, telescopic amplifier 90 is a telescopic amplifier embodiment such as amplifier 50 of FIG. 2, now connected for use as a residue amplifier 85 in the pipelined ADC stage 81 of FIG. 5, for example. The differential inputs INP and INM again are coupled to the gates of the input stage transistors MNINP and MNINM. The cascode output transistors MNCASP and MNCASM form a differential output pair and the drain terminals are coupled to the differential outputs, now labeled VRESP and VRESM, for transmitting the residue voltage to the next stage circuit of the pipelined ADC converter. The common mode feedback circuit 91 is a switched capacitor circuit as is described above and has an output signal CMOUT that is coupled to the gate of tail transistor MNTAIL by the added resistor Rpole. Thus an embodiment is formed by forming a pipelined ADC converter having multiple ADC stages, each including a residue amplifier that is the telescopic amplifier implemented by using one of the embodiment telescopic amplifiers such as shown in FIG. 2, or FIG. 3, as described above, and having the improved common mode settling performance.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A telescopic amplifier, comprising:
   an input stage comprising a first input transistor having a gate terminal coupled to a positive input terminal, and a second input transistor having a gate terminal coupled to a complementary input terminal;
   an output stage comprising a first output transistor having a source coupled to a drain of the first input transistor, and a second output transistor having a source coupled to a drain of the second input transistor, a first output terminal coupled to the drain of the first output transistor, and a second output terminal coupled to the drain of the second output transistor;
   a tail current transistor having a drain coupled to a common source node coupled to the source of each of the first and second input transistors, and having a gate terminal coupled to a tail gate node;
   a common mode feedback circuit having a first feedback input coupled to the first output terminal, and a second feedback input coupled to the second output terminal, and having a common mode reference signal input; and having a common mode output; and
   a resistor coupled between the common mode output and the tail gate node.

2. The telescopic amplifier of claim 1, and further comprising a switched capacitor sampling circuit coupled to the first output terminal and to the second output terminal, and having a first sampling transistor and a first positive output capacitor coupled to sample the voltage at the first output terminal, and having a second sampling transistor and a first complementary output capacitor coupled to sample the voltage at the second output terminal, responsive to a clock signal coupled to the gates of the first sampling transistor and the second sampling transistor.

3. The telescopic amplifier of claim 2, wherein the common mode feedback circuit further comprises a switched capacitor circuit.

4. The telescopic amplifier of claim 3 wherein the common mode feedback circuit further comprises:
   a first transistor coupled between the first output terminal and a first plate of a first sample hold capacitor;
   a second transistor coupled between a reference common mode input and the first plate of the first sample hold capacitor;
   a third transistor coupled between an common mode output signal and a bias node that is coupled to a second plate of the first sample and hold capacitor;
   a fourth transistor coupled between the bias node and a bias voltage input terminal;
   a fifth transistor coupled between the second output terminal and a first plate of a second sample hold capacitor, the second sample hold capacitor having a second plate coupled to the bias node;
   a sixth transistor coupled between the reference common mode input and the first plate of the second sample hold capacitor;
   a first common mode feedback capacitor having a first plate coupled to the first output terminal, and a second plate coupled to the common mode output;
   a second common mode feedback capacitor having a first plate coupled to the second output terminal and a second plate coupled to the common mode output; and the second, fourth and sixth transistors each having a gate coupled to an inverted clock signal, and the first, third and fifth transistors each having a gate coupled to a clock signal, the clock signal being non-overlapping with the inverted clock signal.

5. The telescopic amplifier of claim 4, whereby when the inverted clock signal is active, the voltage across the first sample hold capacitor is a reference common mode voltage received at the reference common mode input minus a bias voltage received at the bias voltage input, and the voltage across the second sample hold capacitor is the reference common mode voltage received at the reference common mode input minus the bias voltage received at the bias voltage input.

6. The telescopic amplifier of claim 5, whereby when the clock signal is active, the first common mode feedback capacitor is shorted to the first sample hold capacitor, and the second common mode feedback capacitor is shorted to the second sample hold capacitor.

7. The telescopic amplifier of claim 4, wherein a common mode feedback open loop gain transfer function of the telescopic amplifier has a dominant pole due to a load capacitance comprising a sum of the first positive output capacitor and a routing capacitance at the first output terminal, and the common mode feedback open loop gain transfer function of the telescopic amplifier further has a non-dominant pole due to the resistor.

8. The telescopic amplifier of claim 7, wherein the non-dominant pole is located at a frequency P2 that is approximately equal to a quantity $(C_{CM}+C_{TAIL}/RpoleC_{CM}C_{TAIL})$, where a capacitance $C_{CM}$ is a sum of the first and second common mode feedback capacitors and the first and the second sample and hold capacitors, a capacitance $C_{TAIL}$ is a sum of the gate to source capacitance of the tail transistor plus the gate to drain capacitance of the tail transistor plus a parasitic routing capacitance at the gate of the tail transistor, and a resistance Rpole is a value of the resistor.

9. The telescopic amplifier of claim 8, where a value for Rpole, the resistor, is a value needed to place the non-dominant pole to provide critical damping of the common mode feedback open loop gain of the telescopic amplifier.

10. The telescopic amplifier of claim 8, where a value for Rpole, the resistor, is determined to be approximately equal to a quantity $(C_L/2\beta^2C_{TAIL}Gmntail)$, where a capacitance $C_{TAIL}$ is a sum of the gate to source capacitance of the tail transistor plus the gate to drain capacitance of the tail transistor plus a parasitic routing capacitance at the gate of the tail transistor, a capacitance $C_L$ is a sum of the first output capacitor at the first output terminal plus the parasitic routing capacitance at the first output terminal, Gmntail is equal to a transconductance of the tail transistor, and $\beta$ is a ratio $(C_{CM}/C_{CM}+C_{TAIL})$ where a capacitance $C_{CM}$ is a sum of the first and second common mode feedback capacitors and the first and the second sample and hold capacitors.

11. A telescopic amplifier, comprising:
a differential input stage for receiving a positive input signal and a complementary input signal comprising a first input transistor having a gate terminal coupled to a positive input terminal, and a second input transistor having a gate terminal coupled to a complementary input terminal, the first input transistor having a drain and the second input transistor having a drain;
a differential output stage for outputting a positive output signal and a complementary output signal comprising a first output transistor having a source coupled to the drain of the first input transistor, and a second output transistor having a source coupled to the drain of the second input transistor and having, and a first output terminal coupled to the drain of the first output transistor, and a second output terminal coupled to the drain of the second output transistor;
a tail current transistor having a drain coupled to a common source node coupled to a source of each of the first and the second input transistors, and having a gate terminal coupled to a tail gate node;
a common mode feedback circuit having a first feedback input coupled to the first output terminal, and a second feedback input coupled to the second output terminal, and having a common mode reference signal input; and having a common mode output; and
a circuit element coupled between the common mode output and the tail gate node, the circuit element being at least one of a source follower transistor and a resistor.

12. The telescopic amplifier of claim 11, wherein the circuit element is the source follower transistor.

13. The telescopic amplifier of claim 11, wherein the circuit element is the resistor.

14. The telescopic amplifier of claim 13, wherein the common mode feedback circuit is a switched capacitor circuit that further comprises:
a first transistor coupled between the first output terminal and a first plate of a first sample hold capacitor;
a second transistor coupled between a reference common mode input and the first plate of the first sample hold capacitor;
a third transistor coupled between an common mode output and a bias node;
a fourth transistor coupled between the bias node and a bias voltage input terminal, the bias node further coupled to a second plate of the first sample hold capacitor;
a fifth transistor coupled between the second output terminal and a first plate of a second sample hold capacitor, the second sample hold capacitor having a second plate coupled to the bias node;
a sixth transistor coupled between the reference common mode input and the first plate of the second sample hold capacitor;
a first common mode feedback capacitor having a first plate coupled to the first output terminal, and a second plate coupled to the common mode output;
a second common mode feedback capacitor having a first plate coupled to the second output terminal and a second plate coupled to the common mode output; and
the second, fourth and sixth transistors each having a gate coupled to an inverted clock signal, and the first, third and fifth transistors having a gate coupled to a clock signal, the clock signal being non-overlapping with the inverted clock signal.

15. The telescopic amplifier of claim 14, and further comprising a switched capacitor sampling circuit coupled to the first output terminal and to the second output terminal, and having a first sampling transistor and a first positive output capacitor coupled to sample the voltage at the first output terminal, and having a second sampling transistor and a first complementary output capacitor coupled to sample the voltage at the second output terminal, responsive to the clock signal.

16. The telescopic amplifier of claim 15, where a value for the resistor is determined so as to place the non-dominant pole to provide critical damping of a common mode feedback open loop gain of the telescopic amplifier.

17. The telescopic amplifier of claim 16, where a value for the resistor is determined to be approximately equal to a quantity $C_L/2\beta^2 C_{TAIL}$Gmntail, where a capacitance $C_{TAIL}$ is a sum of a gate to source capacitance of the tail transistor plus a gate to drain capacitance of the tail transistor plus a parasitic routing capacitance at the gate of the tail transistor, a capacitance $C_L$ is a sum of the first positive output capacitor plus the parasitic routing capacitance at the first output terminal, Gmntail is a transconductance of the tail transistor, and $\beta$ is a ratio $C_{CM}/C_{CM}+C_{TAIL}$, where a capacitance $C_{CM}$ is a sum of the first and second common mode feedback capacitors, and the first and the second sample and hold capacitors.

18. A pipelined ADC converter, comprising:
an input terminal for receiving an analog input voltage;
an N-bit ADC coupled to the input terminal for outputting a quantized digital signal;
an N-bit DAC coupled to the quantized digital signal and outputting an analog voltage corresponding to the quantized digital signal;
a sample and hold circuit coupled to sample and hold an analog input voltage received at the input terminal;
a summer circuit coupled to the sample and hold circuit and to the analog voltage corresponding to the quantized digital signal, outputting a difference voltage that is a residue voltage obtained from subtracting the analog voltage corresponding to the quantized digital signal from the sample and hold analog voltage; and
a telescopic amplifier coupled to the summer circuit to amplify the residue voltage, further comprising:
a differential input stage for receiving a positive input signal and a complementary input signal comprising a first input transistor having a gate terminal coupled to a positive input terminal, and a second input transistor having a gate terminal coupled to a complementary input terminal, the first input transistor having a drain and the second input transistor having a drain;
a differential output stage for outputting a positive output signal and a complementary output signal comprising a first output transistor having a source coupled to the drain of the first input transistor, and a second output transistor having a source coupled to the drain of the second input transistor, and a first output terminal coupled to the drain of the first output transistor, and a second output terminal coupled to the drain of the second output transistor;
a tail current transistor having a drain coupled to a common source node coupled to a source of each of the first and the second input transistors, and having a gate terminal coupled to a tail gate node;
a common mode feedback circuit having a first feedback input coupled to the first output terminal, and a second feedback input coupled to the second output terminal, and having a common mode reference signal input; and having a common mode output; and
a resistive circuit element coupled between the common mode output and the tail gate node.

19. The pipelined ADC converter of claim 18, wherein the circuit element in the telescopic amplifier further comprises a resistor.

20. The pipelined ADC converter of claim 19, wherein the common mode feedback open loop gain transfer function of the telescopic amplifier has a dominant pole due to a load capacitance comprising the sum of an output capacitor coupled to the first output terminal and a routing capacitance at the first output terminal, and the common mode feedback open loop gain transfer function has a non-dominant pole due to the resistor.

* * * * *